(12) United States Patent
Garwatoski

(10) Patent No.: US 6,225,813 B1
(45) Date of Patent: *May 1, 2001

(54) PORTABLE APPARATUS FOR IN SITU FIELD STATOR BAR INSULATION CAPACITANCE MAPPING

(75) Inventor: Frank Joseph Garwatoski, Burnt Hills, NY (US)

(73) Assignee: General Electric Co., Schenectady, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/199,726

(22) Filed: Nov. 25, 1998

Related U.S. Application Data

(62) Division of application No. 08/871,792, filed on Jun. 9, 1997.

(51) Int. Cl.[7] .................................................. G01R 27/26
(52) U.S. Cl. ............................................ 324/690; 324/551
(58) Field of Search ...................................... 324/658, 661, 324/663, 686, 690, 519, 545, 546, 547, 551, 133, 149, 72.5, 772

(56) References Cited

U.S. PATENT DOCUMENTS

| | | | |
|---|---|---|---|
| 1,684,798 | * 9/1928 | Iler et al. | 324/551 |
| 1,769,248 | * 7/1930 | Williams et al. | 324/551 |
| 4,482,860 | 11/1984 | Risko | 324/671 |
| 4,668,912 | 5/1987 | Junker | 324/220 |

(List continued on next page.)

FOREIGN PATENT DOCUMENTS

| | | | |
|---|---|---|---|
| 0 758 158 | 2/1997 | (EP) . | |
| 0 794 437 | 9/1997 | (EP) . | |
| 1-240872 | * 9/1989 | (JP) | 324/551 |
| 4-301579 | * 10/1992 | (JP) | 324/551 |
| 1148-004 | 3/1985 | (RU) . | |

OTHER PUBLICATIONS

"Generator Insitu Inspections" GE Power Generation, Douglas J. Stanton, GE Power Systems, Schenectady, NY. Aug., 1996.

(List continued on next page.)

Primary Examiner—Safet Metjahic
Assistant Examiner—Vincent Q. Nguyen
(74) Attorney, Agent, or Firm—Nixon & Vanderhye

(57) ABSTRACT

A capacitance mapping tool consisting of an improved capacitance probe head assembly having an inflatable electrode bladder mounted at the end of a telescoping support pole is provided for enabling a service technician to accurately position the probe head assembly between stator bars of a large electric motor or power generator from a remote location. Using the tool, capacitance measurements of insulation on stator bars can be obtained without removing the field. The tool is constructed such that it can be inserted between the field generating component (e.g., the rotor) and the stator windings of a large motor or power generator, thus, precluding the need for field removal. A bendable articulated tip section, which remains in a particular bend arrangement until manually reconfigured, is provided at one end of the tool where the capacitance measuring probe head is attached. This allows the probe head to be, preconfigured at a particular angle with respect to the support pole and the stator bars prior to inserting. The probe head includes a bladder support plate which acts as a spacer and is adapted to accept one or more additional spacer plates for changing the overall width of the probe head to adjust for different spacings between stator bars. The pole supports an electric cable from the probe electrode to a remote electric meter and an air hose to a remote fluid source for inflating/deflating the probe bladder.

10 Claims, 4 Drawing Sheets

U.S. PATENT DOCUMENTS

| | | | |
|---|---|---|---|
| 4,841,224 | 6/1989 | Chalupnik et al. | 324/662 |
| 5,070,302 | 12/1991 | Marcus et al. | 324/662 |
| 5,241,277 | 8/1993 | Kefalas | 324/538 |
| 5,546,008 * | 8/1996 | Sminchak et al. | 324/690 |

OTHER PUBLICATIONS

"GE Generator In–Situ Inspection" GE Power Generation, GE PGS Quotation for Georgia Power, Aug. 22, 1996.

* cited by examiner

PORTABLE APPARATUS FOR IN SITU FIELD STATOR BAR INSULATION CAPACITANCE MAPPING

This is a divisional of co-pending application Ser. No. 08/871,792, filed Jun. 9, 1997.

TECHNICAL FIELD

The present invention relates generally to a method and apparatus for inspecting and evaluating water cooled stator windings for possible penetration of water into the groundwall insulation and more specifically to a method for measuring the capacitance of the insulation on a stator winding (bar) in a motor or generator with the field "in situ" (i.e., without disassembling/removing the magnetic field producing components of the motor/generator).

BACKGROUND

In large industrial or utility motors and generators, the stator windings, also known as armature windings, are inspected from time to time to confirm the integrity of the insulation. Each stator winding includes a conductive bar(s) wrapped in layers of insulation. The insulation confines the current in the bars to the bars, prevents arcing of current between windings, and shields the bars against stray objects that could electrically short the bars and to protect people and equipment. In view of the high current levels that flow through industrial generators and motors, the insulation on stator bars must provide an effective and complete barrier surrounding the bars. If the insulating properties of the insulation degrades because it becomes damp or for other reasons, then voltage arcs may jump from the stator bars through degraded regions of the insulation to cause electrical shorts that can harm people and damage equipment.

The insulation on stator bar windings are inspected from time to time to determine whether the insulation has degraded and, if so, to what extent. Stator bars on older water-cooled generators are especially susceptible to water leaks and must undergo regular periodic inspection and testing. One test which has proven very reliable in identifying stator bars with deteriorated groundwall insulation is a capacitance "mapping" of the stator bars. Since the dielectric constant of an insulator provides a measure of its insulating properties, the insulation of an stator bar winding can be inspected by determining the dielectric constant of the insulation. The dielectric constant of the insulator can be calculated by measuring the capacitance of the insulation on the stator bars. The dielectric constant indicates such conditions as the amount of dampness in the insulator. A damp insulator may indicate a leak in the water passages in a water cooled stator. A damp insulator may be water damaged and not functioning as an effective insulator.

All insulating materials have a dielectric constant, which is a measure of the amount of energy the insulating material stores when a voltage is applied across the material. The approximate dielectric constant for air is 1.0 and 80 for water. However, for Micapal™, a common insulation material for stator windings, it is approximately 4 (for undamaged Micapal™). Where there is a mixture of air, water and insulation, the measured capacitance will be a different composite number. Because of the large difference in the dielectric constants for Micapal™ (and other winding insulators) and water, the dielectric constant changes relatively dramatically when an insulator for a winding becomes damp. Accordingly, measuring the dielectric constant of an insulator provides an effective means for detecting water logged insulation on stator windings.

The dielectric constant for a stator insulator can be calculated using capacitance values measured across the insulator. Capacitance and the dielectric constant are related as described in the following equation:

$$C = kDA/t$$

Where: $D$ = dielectric constant of the insulation $A$ = area of the probe electrode $t$ = thickness of the insulation Because the area ($A$) of a probe electrode and thickness ($t$) of the insulator are know quantities and the capacitance ($C$) of the insulator is a measured quantity, the dielectric constant ($D$) can be relatively easily calculated with the above equation. A meter is used to measure the capacitance across the insulation between the electrode and the stator bar conductor. Each stator bar in the winding is measured at both ends of the core and statistical analysis is used to identify those bars with higher than normal expected capacitance. A relatively higher capacitance is a good indication of moisture present in the insulation.

To obtain accurate capacitance measurements of the insulation on stator bars, the capacitance measurement probe must be precisely inserted into the proper position between adjacent stator bars and the electrode placed firmly against the insulated surface of the particular stator bar measured. In this manner, a "mapping" of insulation capacitance for a particular motor or generator could be compiled and used to identify stator bars with damaged or faulty insulation. Consequently, a special capacitance probe having an inflatable bladder was developed for improving the accuracy and ease with which such measurements are made. The special probe developed is the subject of commonly assigned U.S. Pat. No. 5,546,008 issued Aug. 13, 1996, to Sminchak et al., entitled "INFLATABLE CAPACITANCE MEASURING DEVICE", which is incorporated by reference herein. Unfortunately, capacitance mapping using such a probe required disassembly of the generator and removal of the field producing component (i.e., the rotor) so that the stator bars were accessible to a service technician for inserting and properly positioning the probe at the desired positions between adjacent stator bars. Since removal of the field from a large motor or power generator is an expensive and time consuming process, capacitance mapping was usually a last resort maintenance or inspection procedure.

DISCLOSURE OF THE INVENTION

To satisfy the need to reduce the time and expense of performing stator bar inspection and capacitance mapping for generators and motors, the current invention presents an improved inspection method and capacitance mapping kit developed to allow measurement of the capacitance of the insulation wrap on stator bars with the field "in situ" (i.e., still in place) such that less disassembly of the electromagnetic generator or motor is required. The kit includes several diagnostic tools including a capacitance probe tool having an improved capacitance probe head structure (which uses a version of the inflatable electrode bladder described in above mentioned patent) and a versatile probe head support arm for accurately positioning the probe head in between stator bars from a remote location—thus, precluding the need to remove the field producing component of the motor or generator. In addition, the kit includes one or more pressure regulator (step-down) valves, a small remote "portable" pressure regulator actuator unit (which may be conveniently worn on the belt of a user), a capacitance meter, as well as various lengths of appropriate electric cables and air hoses as appropriate. The capacitance probe tool consists of a narrow elongated pole (support arm) having a telescoping main section and a bendable, rotatable articulated tip section at one end. The improved capacitance measuring probe head structure is attached to the support arm at the end of the articulated tip section which remains bent at a particular desired configuration until manually reconfigured. The improved probe head includes a bladder support plate which acts as a spacer and is adapted to accept one or more additional spacer plates for changing the overall width of the probe head structure. The probe head support arm also supports an electric cable from the probe electrode to a remote electric meter and an air hose to a remote fluid source for inflating/deflating the probe bladder. The arm may also support a mount for a miniature TV camera, a telescoping mirror, and/or an electric lamp for illumination.

In accordance with the method of the present invention, the probe head may be accurately positioned by an inspection technician between stator bars at the requisite measurement sites which were—previous to the advent of this invention—inaccessible without removal of the field (rotor). To accomplish this, the capacitance probe head support arm is adjusted by moving the telescoping section to the proper length and bending and/or rotating the articulated tip section to a stable configuration that permits positioning of the probe head at/in a location between stator bars. The technician can then extend the probe head between the rotor and stator (or other obstacles as the case may be) to the appropriate measurement site while keeping the probe head assembly properly oriented with respect to the stator bars for proper positioning. The probe electrode bladder is then inflated to wedge the probe head assembly firmly in place between adjacent stator bars to ensure full contact of the probe electrode with the bar insulation at the desired measurement point. A portable actuator for remotely controlling a pressure/vacuum source to inflate and deflate the probe electrode bladder is provided so that the technician need not change position. This process is repeated for each stator bar and the measured capacitance values are recorded. A histogram of capacitance values is formulated and used to identify stator bars suspected of having faulty insulation. Capacitance values which are found to be more than three standard deviations greater than the "average" value measured for a particular motor or generator are considered suspect. Using the "in situ" inspection apparatus and method of the present invention, the risk and cost associated with generator (or motor) disassembly and inspection can be significantly reduced.

BRIEF DESCRIPTION OF THE DRAWINGS

These and other features and advantages of the present invention will -become more completely understood by referring to the following detailed description of presently preferred exemplary embodiments in conjunction with the FIGURES in which like reference numerals refer to like elements throughout.

BEST MODE FOR CARRYING OUT THE INVENTION

In the following description, for purposes of explanation and not limitation, specific details are set forth, such as particular circuits, circuit components, interfaces, techniques, etc. in order to provide a thorough understanding of the present invention. However, it will be apparent to one skilled in the art that the present invention may be practiced in other embodiments that depart from these specific details. In other instances, detailed descriptions of well known methods and programming procedures, devices, and circuits are omitted so not to obscure the description of the present invention with unnecessary detail.

Figure 1:
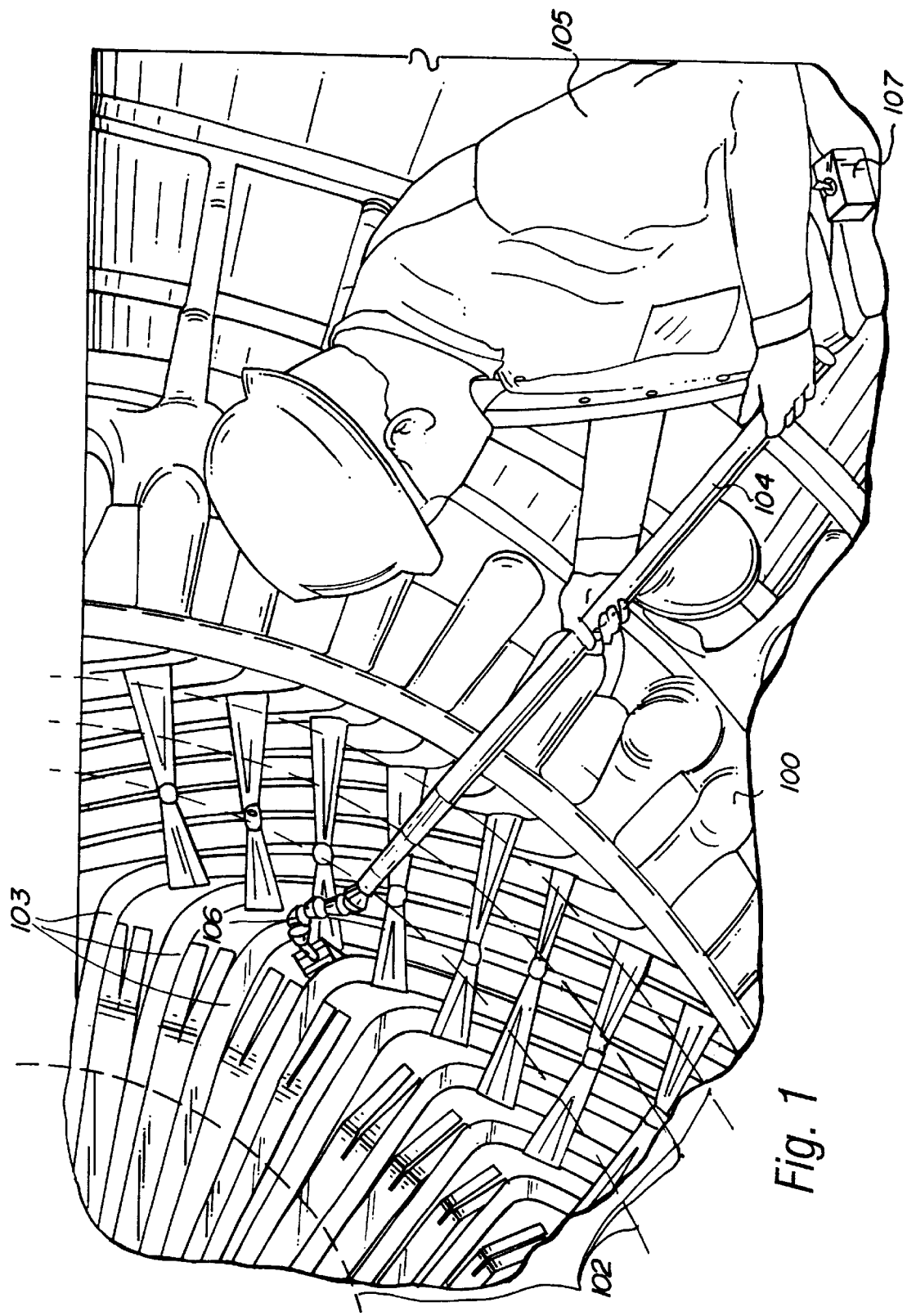
FIG. 1 is a diagrammatic illustration of a service technician positioning an in situ capacitance measurement apparatus between adjacent generator stator bars in accordance with the method of the present invention.

FIG. 1 shows an example of the in situ capacitance mapping tool being positioned by a technician between adjacent generator stator bars as used in accordance with a method of the present invention. One end of a large power generator 100 is shown with the field generating component, i.e., rotor 102, illustrated in transparency by dotted lines. Stator bar windings 103 line the inner circumference of the main body of. generator 100. Spaces between adjacent stator bars are often inaccessible due to the presence of rotor 102 and the proximity of the rotor to the stator bar windings. However, a trained technician can usually locate desired capacitance measurement points by peering in between the narrow spacing between rotor and stator components of the generator. In accordance with the present invention, a field technician 105 is able to access areas between rotor 102 and the main body stator windings of generator 100 by extending support arm 104 of the capacitance measuring tool to an appropriate length and inserting the probe end of the tool between rotor 102 and stator windings 103 to the desired position.

The probe end of the capacitance mapping tool has a bendable articulated jointed) section 106 that may be used to align the probe head in a convenient orientation for easy insertion between stator bars prior to extending support arm 104 between the rotor and stator. Once the probe head is properly positioned between adjacent stator bars at a desired measurement point, the technician operates a pneumatic (or electrical) switch located on a remote pressure controller/ actuator box 107 causing inflation of an expandable bladder integral to the probe head. Inflation of the bladder secures the probe head in place between adjacent stator bars so that a measurement can be taken. Actuator box 107 controls a remote source of pressure/vacuum connected to the probe head bladder via an appropriate length of narrow tubing (not shown). This arrangement allows a technician to carefully manipulate the probe support arm 104 to align the probe head accurately into position and then control inflation/ deflation of the probe bladder without having to change his position or the orientation of the probe head. In addition, the pressure/vacuum source (which is most likely to be rather bulky) can be located at a remote location where space permits.

Figure 2:
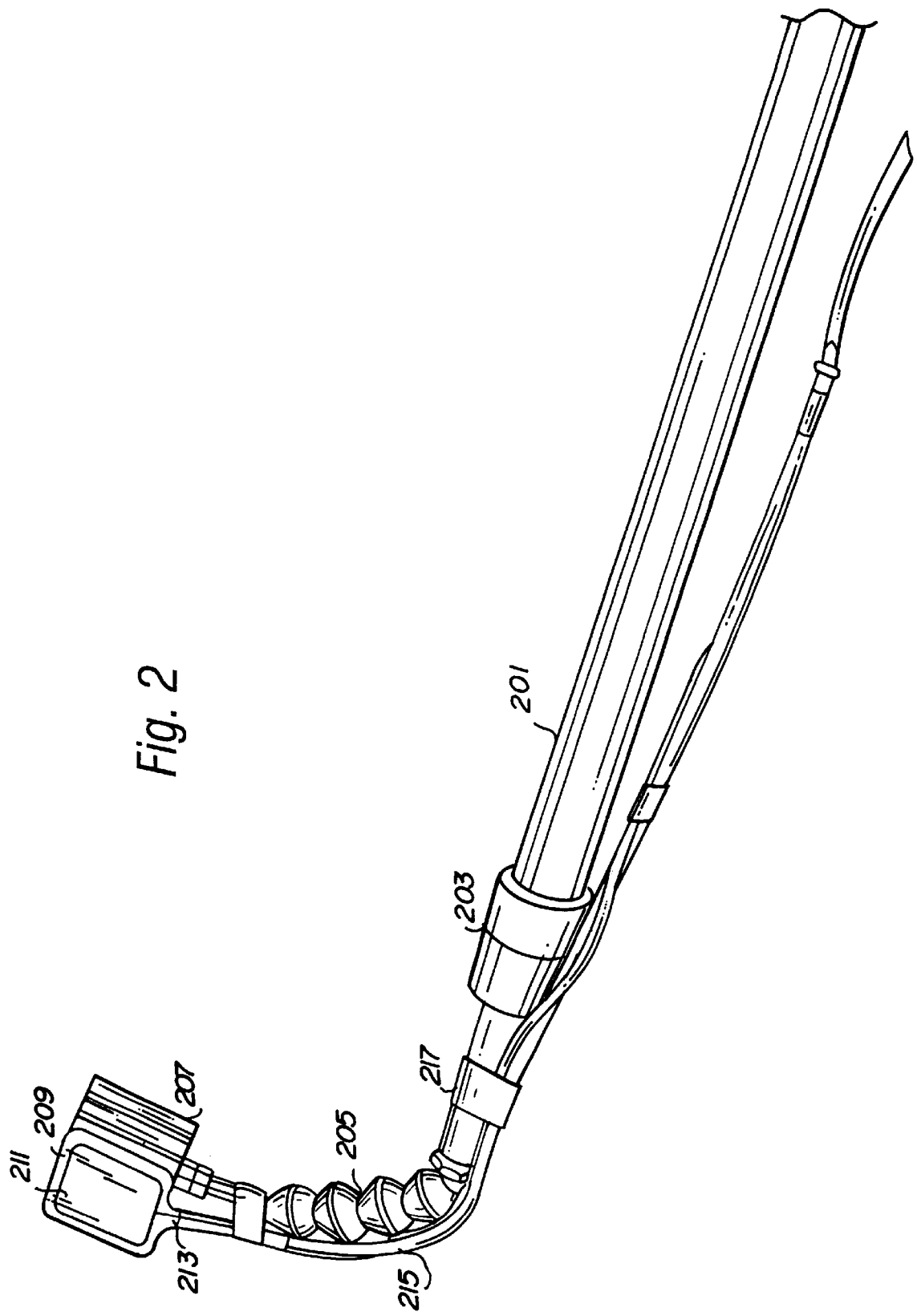
FIG. 2 is a detailed illustration of the capacitance measuring tool showing the telescoping section and the configurable articulated section of the support arm in accordance with the present invention.

Referring now to FIG. 2, a detailed illustration of the capacitance measuring tool is discussed. Basically, the measuring tool consists of a support arm or pole 201 that is provided with a telescoping section 203 (shown here in a collapsed configuration) and a bendablerotatable articulated tip section 205 which supports probe head member 207. An inflatable expansion bladder 209 is secured to one face of probe head 207. The bladder may be rectangular or circular and is basically pancake-shaped. The open face of bladder 209 is provided with a conductive material or a flat electrode 211 that is connected via electrical cable 213 to a remote meter. Bladder 209 is coupled via tubing 215 to a remote pressure/vacuum source (not shown). Cable ties 217 or the like secure tubing 215 and electric cable 213 to the capacitance mapping tool at appropriate locations along support arm 201.

Figure 3:
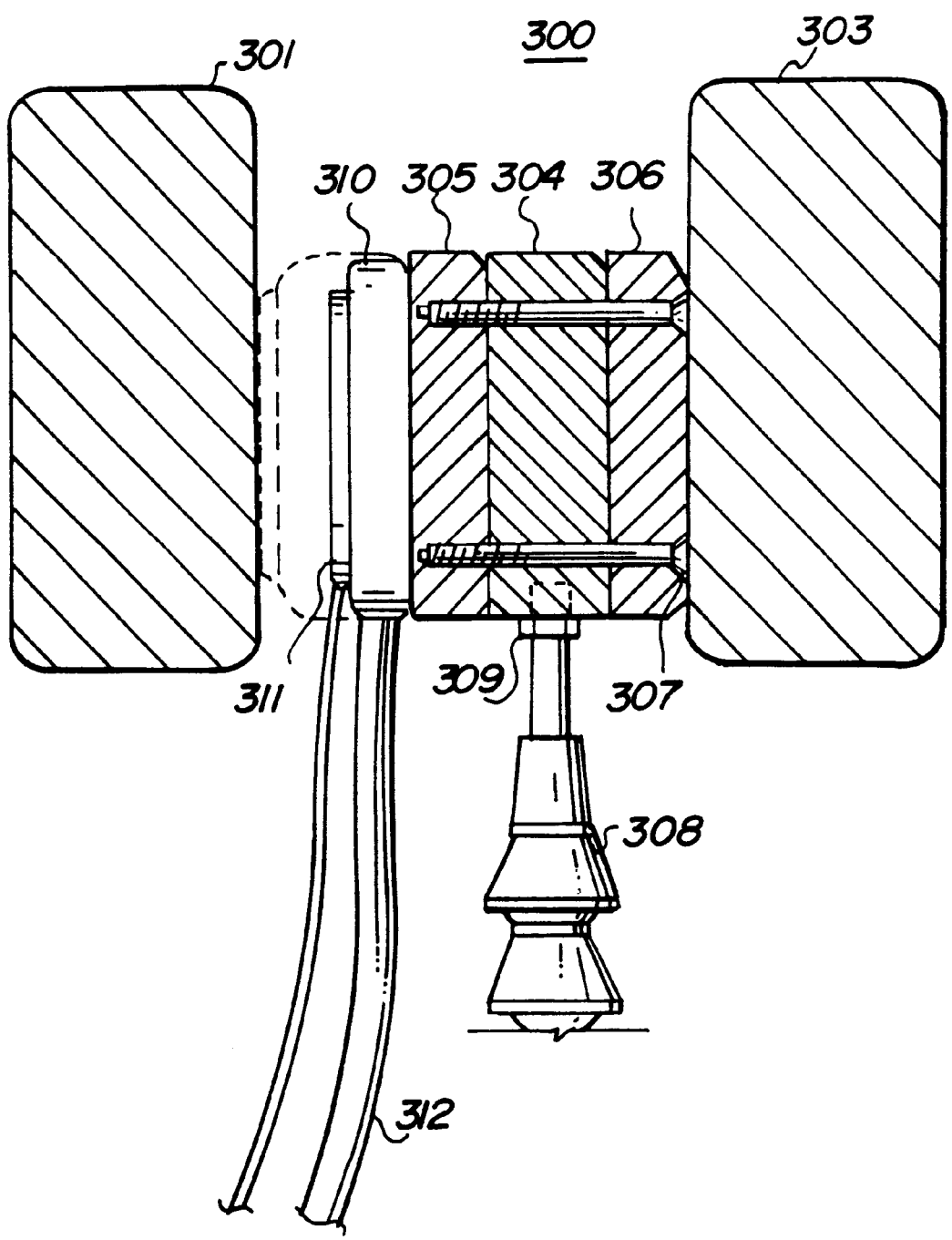
FIG. 3 is detailed illustration of the capacitance measuring tool showing the probe head spacer plates electrode and inflatable bladder arrangement.

Referring now to FIG. 3, a more detailed illustration of probe head 207 of FIG. 2 is discussed. In this FIGURE, an example capacitance measuring tool probe head 300 is shown in cross section as positioned between adjacent stator bars 301 and 303. Basically, the probe head consists of a primary support block 304 having one or more spacer plates 305 and 306 of various widths. The spacer plates are detachably secured to primary support block 304 by screws 307 or by other appropriate hardware. Primary support block 304 is secured via conventional means to a threaded end portion 309 of articulated tip 308 of the probe support arm. An expandable bladder 310, having an attached surface electrode 311, is shown in an uninflated (collapsed) condition attached to spacer plate 305. Alternatively, the probe bladder and electrode arrangement could be secured to an open face of primary support block 304. Bladder 310 is secured on one surface (side) with Velcro™ or (some otherwise suitable attachment method) to the open face of spacer plate 305 and electrode 311 is glued or bonded to the opposite surface of bladder 310 in a manner that allows bladder 310 to expand when supplied with a fluid under pressure via tube 312.

One or more additional spacer plate(s) 306 of an appropriate thickness are chosen such that the spacers and bladder fit in between adjacent stator bars without dragging so that when bladder 310 is inflated (as indicated by the dotted lines in FIG. 3), the surface of electrode 311 will be placed in full and uniform contact with the insulated surface of a stator bar. Preferably, bladder 310 is inflated from a controlled fluid pressure source to a predetermined pressure each time a measurement is taken. This arrangement ensures that the entire surface of electrode 311 will be pressed against the surface insulation of the stator bar without "ballooning" and with an identical force in a consistent manner for each measurement taken. In the presently preferred example embodiment, the probe bladder is consistently inflated to a pressure of approximately 5 PSI for each measurement. In this manner, the bladder remains flat when inflated (not "bubbled") to provide more accurate and consistent measurements.

Figure 4:
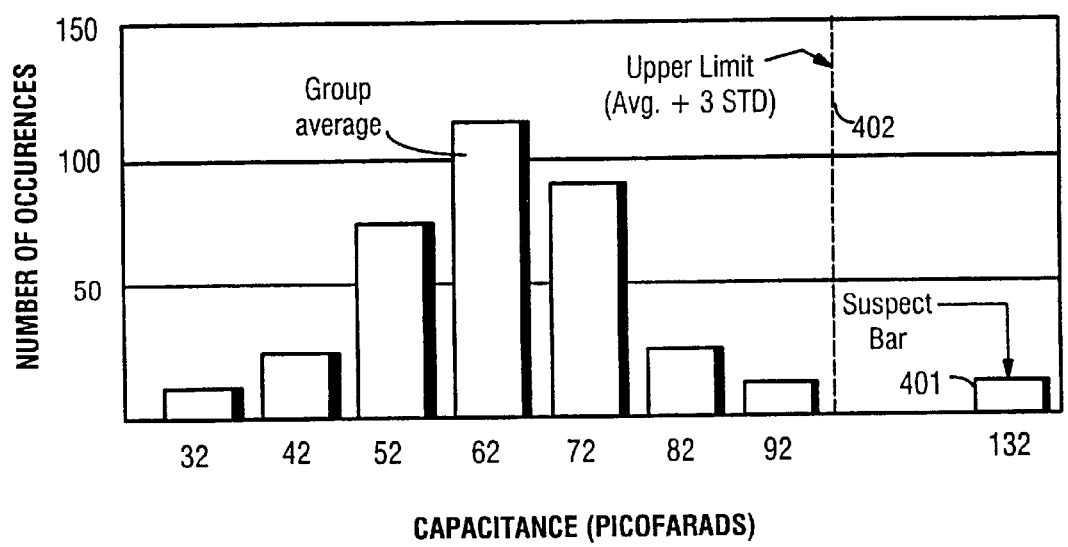
FIG. 4 is a diagram illustrating an example stator winding capacitance histogram plot revealing a suspect damaged bar.

FIG. 4 shows an example bar-graph histogram compiled from multiple stator winding capacitance measurements. A histogram of capacitance measurements taken from numerous stator bars can provide a good indication of stator bars suspected of having damaged insulation. In the histogram, various ranges of measured capacitance values are plotted against the number of measurements occurring in each range. Dotted line 402 indicates an upper limit for "acceptable" capacitance values. Generally, measurements that result in a capacitance value of more than three standard deviations above an "average" value for a group of measurements corresponding to most of the stator bars in the generator are indicative of damaged insulation. For the example shown in FIG. 4, an average measured value for the group of measurements is in the range of approximately 62 pf. A value measured in the range of 132 pf, corresponding to column 401, is more than three standard deviations above the average range for this particular generator. Abnormal measurements of this sort can be correlated to a particular measurement site and used to identify a suspect stator bar for further examination.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A portable hand-held apparatus for measuring the capacitance of insulation on a stator bar in a motor or generator in situ, comprising:

a support pole having a telescoping section and a bendable end section, wherein said end section is bendable along its length for configuring a tip portion at a variety of spatial orientations relative to said telescoping section; and a capacitance probe mounted at the tip portion of the bendable end section of the support pole, said probe comprising:
      a conductive electrode pad having a first surface adapted to contact a surface of the insulation,
      a bladder attached to a second surface of the electrode pad, said bladder adapted to expand when tilled with a fluid,
      a probe support plate attached to an outside surface of the bladder opposite the electrode pad, wherein the support plate portion of the probe is secured to the tip portion of the bendable end section, and
      at least one spacer plate detachably secured to the support plate, said spacer plate having predetermined a thickness such that an effective width of the probe can be selectively altered by mounting one or more spacer plates to the support plate to allow the probe to fit snugly between adjacent stator bars of various separation even when the bladder is expanded using low fluid pressures which preclude a ballooning of the bladder.

2. The apparatus of claim 1 wherein the bendable end section of the support pole comprises a plurality of articulated portions each capable of movement in at least two directions.

3. The apparatus of claim 1 wherein the bendable end section of the support pole retains a particular bend configuration until manually reconfigured.

4. The apparatus of claim 1 wherein the fluid is pressurized air.

5. A portable stator insulation testing kit apparatus for measuring the capacitance of insulation on a stator bar in a motor or generator in situ, comprising:

a portable capacitance measuring probe portion comprising a conductive electrode secured to an expandable bladder;

a portable pressure actuator switch box portion, said switch box remotely initiating an inflation or deflation of said expandable bladder;

a capacitance measuring probe positioning tool portion comprising a support arm having at least one telescoping section and a bendable tip section, said tip section being bendable along its length and said capacitance measuring probe portion being removably mounted on said tip section; and a probe support portion removably attachable to said tip section for mounting the capacitance measuring probe portion on said tip section, said probe support portion comprising a bladder support plate and one or more detachably mounted spacer plates of predetermined thickness, wherein one or more spacer plates may be detachably mounted to the bladder support plate to alter the thickness of the probe portion.

6. The portable stator insulation testing kit as set forth in claim 5, further including a capacitance meter.

7. The apparatus of claim 5 wherein the bendable tip section of the probe positioning tool comprises a plurality of articulated portions each capable of movement in at least two directions.

8. The apparatus of claim 5 wherein the bendable tip section retains a particular bend configuration until manually reconfigured.

9. The portable capacitance probe kit as set forth in claim 5 wherein said portable actuator box portion is adapted to be mounted to a waist belt worn by a person.

10. The portable capacitance probe kit as set forth in claim 5 further comprising a plurality of spacer plates of predetermined thickness.

* * * * *